(12) United States Patent
Kataoka et al.

(10) Patent No.: US 10,115,691 B2
(45) Date of Patent: Oct. 30, 2018

(54) MODULE, METHOD FOR MANUFACTURING THE SAME, AND ELECTRONIC DEVICE

(71) Applicant: CANON KABUSHIKI KAISHA, Tokyo (JP)

(72) Inventors: Ichiro Kataoka, Kawasaki (JP); Takahiro Hachisu, Isehara (JP); Tadashi Kosaka, Atsugi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/491,582

(22) Filed: Apr. 19, 2017

(65) Prior Publication Data

US 2017/0330852 A1 Nov. 16, 2017

(30) Foreign Application Priority Data

May 13, 2016 (JP) ................................ 2016-097385

(51) Int. Cl.
*H01L 23/00* (2006.01)
*H05K 1/18* (2006.01)
(Continued)

(52) U.S. Cl.
CPC .............. *H01L 24/13* (2013.01); *H01L 24/16* (2013.01); *H01L 24/81* (2013.01); *H01L 27/14636* (2013.01); *H04N 5/335* (2013.01); *H05K 1/11* (2013.01); *H05K 1/181* (2013.01); *H01L 2224/13026* (2013.01); *H01L 2224/1369* (2013.01); *H01L 2224/13562* (2013.01); *H01L 2224/13691* (2013.01); *H01L 2224/16227* (2013.01); *H01L 2224/81815* (2013.01); *H01L 2924/061* (2013.01); *H01L 2924/062* (2013.01); *H01L 2924/066* (2013.01); *H01L 2924/0635* (2013.01); *H01L 2924/07025* (2013.01); *H05K 2201/10121* (2013.01);
(Continued)

(58) Field of Classification Search
CPC ... H01L 23/49827; H01L 24/13; H01L 24/16; H01L 27/146–27/14893; H01L 2224/10126; H01L 2224/1056; H01L 2224/1369; H01L 2224/13691
See application file for complete search history.

(56) References Cited

U.S. PATENT DOCUMENTS 5,847,456 A 12/1998 Shoji
5,925,936 A 7/1999 Yamaji
(Continued)

FOREIGN PATENT DOCUMENTS

JP 5-007866 B2 1/1993
JP 8-102464 A 4/1996
(Continued)

*Primary Examiner* — Daniel Shook
(74) *Attorney, Agent, or Firm* — Fitzpatrick, Cella, Harper & Scinto

(57) ABSTRACT

A module, comprising an electronic component having a first electrode, a mounting board having a second electrode, a solder-bump configured to connect the first electrode and the second electrode, and a thermoplastic resin member configured to contact both the first electrode and the second electrode and cover the solder-bump, so as to form a space between the electronic component and the mounting board.

13 Claims, 4 Drawing Sheets

(51) Int. Cl.
*H05K 1/11* (2006.01)
*H01L 27/146* (2006.01)
*H04N 5/335* (2011.01)

(52) U.S. Cl.
CPC .............. *H05K 2201/10151* (2013.01); *H05K 2201/10378* (2013.01); *H05K 2201/10734* (2013.01)

(56) References Cited

U.S. PATENT DOCUMENTS

| | | | |
|---|---|---|---|
| 6,171,887 | B1 | 1/2001 | Yamaji |
| 2001/0013653 | A1 | 8/2001 | Shoji |
| 2003/0068847 | A1 | 4/2003 | Watanabe et al. |
| 2004/0046252 | A1* | 3/2004 | Fujimori ............... H01L 21/563 |
| | | | 257/734 |
| 2011/0147782 | A1* | 6/2011 | Sano ................. H01L 27/14618 |
| | | | 257/98 |
| 2016/0181215 | A1* | 6/2016 | Sullivan ............ H01L 23/49827 |
| | | | 257/737 |

FOREIGN PATENT DOCUMENTS

| | | |
|---|---|---|
| JP | 2842361 B2 | 1/1999 |
| JP | 2000-058709 A | 2/2000 |
| JP | 3376203 B2 | 2/2003 |
| JP | 2003-100948 A | 4/2003 |
| JP | 3836349 A | 10/2006 |

\* cited by examiner

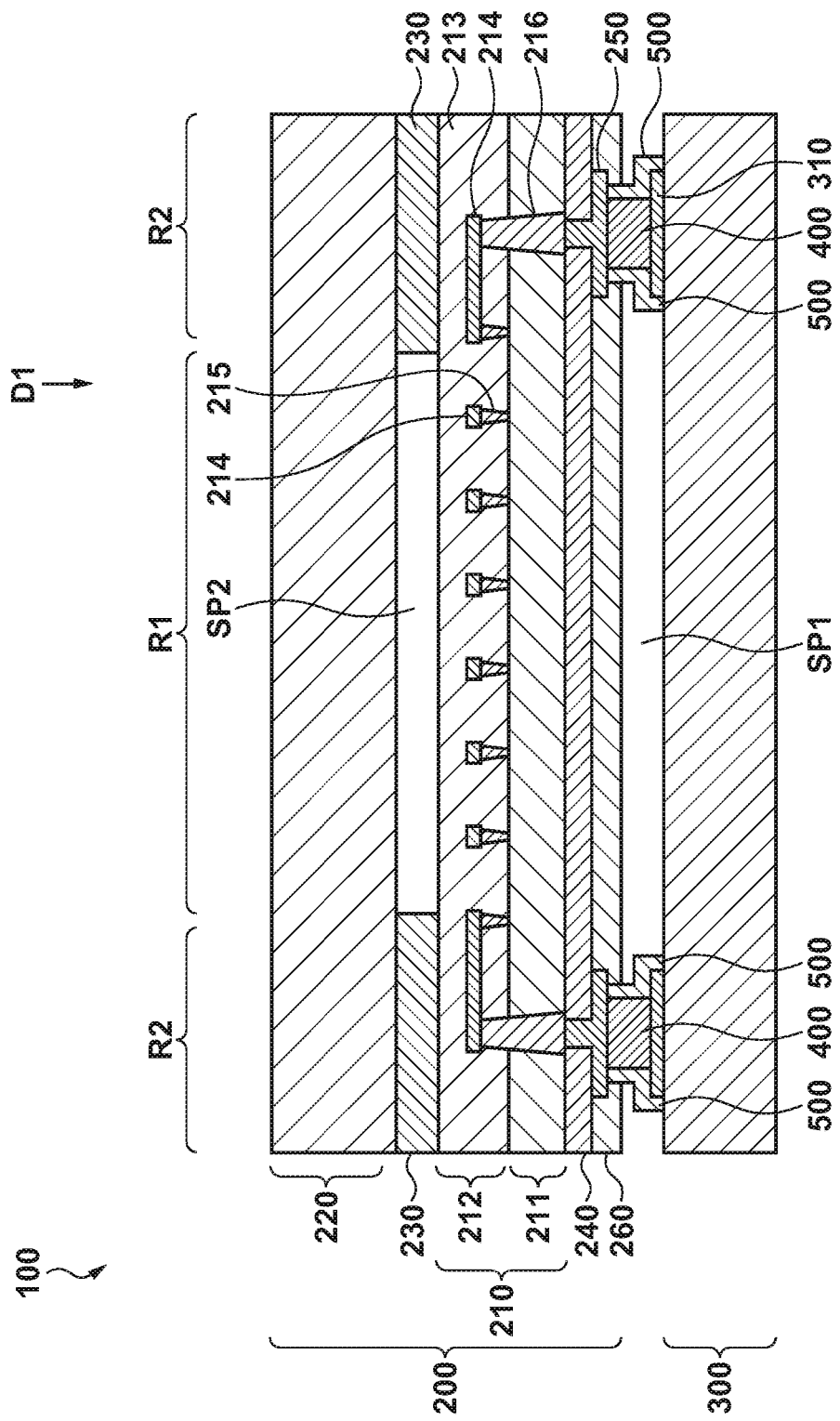

MODULE, METHOD FOR MANUFACTURING THE SAME, AND ELECTRONIC DEVICE

BACKGROUND OF THE INVENTION

Field of the Invention

The present invention relates to a module, a method for manufacturing the same, and an electronic device.

Description of the Related Art

There are cases in which in a module (may also be called an electronic apparatus), an electronic component including a semiconductor device or the like is attached to a mounting board such as a printed board. In such a module, for example, the electronic component comprises a first electrode on a bottom surface side, and the mounting board comprises a second electrode on a top surface side, and the electronic component and the mounting board are fixed so that the first electrode and the second electrode are connected electrically to each other by a solder-bump.

In Japanese Patent Laid-Open No. 2003-100948, a configuration in which an electronic component and a mounting board are connected by a solder-bump is disclosed. In a space between the electronic component and the mounting board, a resin is arranged in the periphery of the base of the solder-bump (a portion on the electronic component side and a portion on the mounting board side). Here, a thermosetting resin is used for the resin in Japanese Patent Laid-Open No. 2003-100948. For this reason, there is a possibility that deformation, cracking or the like will occur in the module due to stress that can occur in each member caused by shrinkage at the time of thermosetting of the resin, and this can cause a reduction in the reliability of the module in the configuration of Japanese Patent Laid-Open No. 2003-100948. Accordingly, a technique that is advantageous at improving the reliability of such a module is necessary.

SUMMARY OF THE INVENTION

The present invention provides a technique that is advantageous at improving the reliability of a module comprising an electronic component and a mounting board that are connected to each other.

One of the aspects of the present invention provides a module, comprising an electronic component having a first electrode, a mounting board having a second electrode, a solder-bump configured to connect the first electrode and the second electrode, and a thermoplastic resin member configured to contact both the first electrode and the second electrode and cover the solder-bump, so as to form a space between the electronic component and the mounting board.

Further features of the present invention will become apparent from the following description of exemplary embodiments with reference to the attached drawings.

BRIEF DESCRIPTION OF THE DRAWINGS

FIG. 1 is a view for describing an example of a configuration of a module equipped with an electronic component and a mounting board.

DESCRIPTION OF THE EMBODIMENTS

Figure 2D:
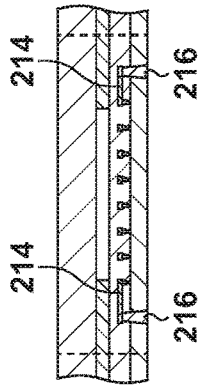
FIGS. 2A-2L are views for describing an example of a method for manufacturing a module.

Hereinafter, explanation will be given regarding a preferred embodiment of the present invention with reference to the attached drawings. Note that each drawing is given merely with the objective of describing the structure and configuration, and the dimensions of each member shown graphically do not necessarily reflect the actual dimensions. Also, in the drawings, the same reference numerals are given to members that are the same and elements that are the same, and duplicate descriptions of content are omitted below.

FIG. 1 illustrates an example of a configuration of a module 100 according to an embodiment of the present invention. The module 100 comprises an electronic component 200, a mounting board 300, and a solder-bump 400, and the electronic component 200 and the mounting board 300 are connected by the solder-bump 400. The electronic component 200 is a device in which the semiconductor chip is packaged, and may also be called an electronic device, a semiconductor device or the like. The mounting board 300 is a circuit board for mounting the electronic component 200, and can include a printed board (a printed circuit board). The module 100 may also be called an electronic apparatus.

More specifically, the electronic component 200 has a first electrode 250 on a surface (the bottom surface in the drawing) on the mounting board 300 side, and the mounting board 300 has a second electrode 310 on a surface (the top surface in the drawing) on the electronic component 200 side. The solder-bump 400 electrically connects the first electrode 250 and the second electrode 310, and by this, the electronic component 200 and the mounting board 300 are connected to each other and are fixed. The electronic component 200 and the mounting board 300 are fixed to be separated by a predetermined distance.

In the present embodiment, the electronic component 200 is an image sensor (that is, the module 100 is an image capturing module for a camera). The electronic component 200 includes a capture area R1 that forms an image capturing surface and a peripheral area R2 in a plan view (a plan view with respect to a surface opposite the mounting board 300. that is, an orthogonal projection in a direction D1 in the drawing). Out of the capture area R1 and the peripheral area R2, the first electrode 250 is arranged in the peripheral area R2.

In the present embodiment, the electronic component 200 has a structure of a wafer level chip size package (WL-CSP) which is described later in detail. Specifically, the electronic component 200 further has a structure 210, a glass board 220, and an adhesion member 230. The structure 210 includes a semiconductor board 211 and a wiring structure 212, and among these the semiconductor board 211 is arranged on the mounting board 300 side.

The semiconductor board 211 is a board configured by silicon, for example. The semiconductor board 211, in the capture area R1, has a plurality of pixels (not shown) that each include a photoelectric conversion element and a transistor for outputting a signal according to a charge that is produced in the photoelectric conversion element. Also, the semiconductor board 211 further has a peripheral circuit (not shown) for reading out a signal from the plurality of pixels in the peripheral area R2.

The wiring structure 212 has an insulating member 213, an electrically conductive member 214, and a contact plug 215. The insulating member 213 can be configured by an insulating material such as, for example, silicon oxide ($SiO_2$), silicon nitride ($Si_3N_4$) or the like, and typically a plurality of insulating layers are stacked. The electrically conductive member 214 is contained in the insulating member 213, and may be configured by a metal such as, for example, copper (Cu), aluminum (Al), or the like. The contact plug 215 may be configured by a metal such as, for example, titanium (Ti), tungsten (W), or the like, and electrically connects an element on the semiconductor board 211 and the electrically conductive member 214. Here, an example is given in which a single layer wiring structure for which the number of wiring layers is one is made to be the wiring structure 212, but the wiring structure 212 may be a multilayer wiring structure for which the number of wiring layers is two or more.

The structure 210 further has a through electrode 216 which is connected to the first electrode 250, and which extends so as to penetrate the semiconductor board 211 from the bottom surface (the surface of the side of the mounting board 300) of the semiconductor board 211 through until the electrically conductive member 214 which is contained in the wiring structure 212. The semiconductor board 211 and the through electrode 216 are electrically separated by an insulating film (not shown) arranged therebetween. Note that the through electrode may be called a silicon through electrode (TSV (Though Silicon Via)).

The electronic component 200 further has an insulating layer 240 and a protective layer 260 arranged on the bottom surface side (the side of the mounting board 300) of the structure 210. The insulating layer 240 and the protective layer 260 each have an opening in which the first electrode 250 is arranged. The insulating layer 240 may be comprised by an insulating material such as silicon oxide in the present embodiment, and electrically separates the semiconductor board 211 and the first electrode 250 on the bottom surface side of the semiconductor board 211. The protective layer 260 may be comprised by an insulating resin in the present embodiment, and protects the bottom surface side of the electronic component 200.

The glass board 220 is a plate component configured by a transparent material such as glass. The glass board 220 corresponds to an opposing board, and is arranged on the side opposite to the side of the mounting board 300 in relation to the structure 210. That is, in relation to the structure 210, the glass board 220 is arranged on a light incidence side.

The adhesion member 230 is arranged to overlap the peripheral area R2 in a plan view, and adheres the structure 210 to the glass board 220 while forming a second space SP2 between the structure 210 and the glass board 220. Note that in the structure 210, the structure 210 and the glass board 220 may be coupled by a predetermined joint member, and in other embodiments, an adhesive sheet and a member that is not adhesive, for example, may be used together in place of the adhesion member 230.

On the top surface (the surface on the side of the space SP2) of the wiring structure 212, a plurality of microlenses (not shown) corresponding to the foregoing of plurality of pixels are formed, and each microlens focuses incident light and guides it to a corresponding pixel.

The solder-bump 400 is arranged at a position overlapping with the peripheral area R2 in a plan view, similarly to the adhesion member 230. By this configuration, the influence on the module 100 of a stress arising between the members due to the difference in thermal expansion coefficient may be reduced. In particular, the influence due to stress arising in a portion connected to the mounting board 300 and the vicinity thereof in the electronic component 200 due to the solder-bump 400 may be reduced.

Here, the module 100 further comprises a resin member 500 covering the solder-bump 400. The resin member 500 is arranged to form a space SP1 between the electronic component 200 and the mounting board 300 and cover the solder-bump 400, and may be represented by a resin film, a coating, or the like. By this configuration, an influence on the module 100 of a stress arising between respective members may be reduced as compared to a case when resin for adhesion is filled in between the electronic component 200 and the mounting board 300 (that is, the space SP1).

The resin member 500 contacts both the first electrode 250 and the second electrode 310 and fixes the electronic component 200 and the mounting board 300 to each other. In another representation, the resin member 500 extends from the first electrode 250 side to the second electrode 310 side contacting both of these and covering the solder-bump 400, and reinforces the fixing between the electronic component 200 and the mounting board 300 by the solder-bump 400. Also, the second electrode 310 is not exposed in the space SP1, and is covered by the resin member 500 in the portions other than the portion contacting the solder-bump 400. By this, the second electrode 310 and the solder-bump 400 are more firmly fixed.

Here, the resin member 500 is configured by thermoplastic resin. By this, it is possible to realize appropriate attachment/detachment of the electronic component 200 and the mounting board 300 by a heat process. This is advantageous in cases in which attachment (mounting) of the electronic component 200 to the mounting board 300 is redone and cases in which the electronic component 200 attached to the mounting board 300 is switched with another electronic component.

The resin member 500 is advantageously configured so that a glass-transition temperature thereof is less than the melting point of the solder-bump 400. By this, as is described later in detail, the resin member 500 softens before the solder-bump 400 melts when heat is applied, which is advantageous when attaching the electronic component 200 to the mounting board 300. Note that the glass-transition temperature is typically described as a temperature at which physical properties such as the rigidity, viscosity, or the like sharply change when increasing/decreasing the temperature of chainlike polymer material such as a resin, and may be measured by differential scanning calorimetry (DSC) or the like for example.

In FIG. 1, two of each of the first electrode 250 and the second electrode 310 are illustrated, but the number of these electrodes may be three or more. That is, the electronic component 200 may have a plurality of the first electrode 250 and the mounting board 300 may have a plurality of the second electrode 310, and the module 100 may comprise a plurality of the solder-bump 400. Also, a plurality of the solder-bump 400 may connect the plurality of the first electrode 250 and the plurality of the second electrode 310. In such a case, the resin member 500 covers each of the plurality of the solder-bump 400 while forming the space SP1 between the electronic component 200 and the mounting board 300, and contacts both of the first electrode 250 and the second electrode 310 corresponding thereto, and fixes the electronic component 200 and the mounting board 300 to each other. By such a configuration, the fixing of the electronic component 200 and the mounting board 300 by the solder-bump 400 becomes firmer.

Some of the plurality of the first electrode 250 may be arranged to line up in a direction orthogonal to the paper surface of FIG. 1 (similar for a plurality of the second electrode 310 and a plurality of the solder-bump 400). Here, when two of the solder-bump 400 which are adjacent to each other are assumed to be a first bump $400_1$ and a second bump $400_2$, it may be such that the resin member 500 that covers the first bump $400_1$ and the resin member 500 that covers the second bump $400_2$ do not contact each other. By this, an influence on the module 100 of a stress arising between respective members in a case in which the number of the solder-bump 400 becomes greater may be reduced.

By virtue of the present embodiment, the resin member 500 covers, so as to fix the electronic component 200 and the mounting board 300 by contacting both the first electrode 250 and the second electrode 310, each solder-bump 400 that connects the electronic component 200 and the mounting board 300 to each other. Because the influence on the module 100 of stress arising between respective members in the module 100 is reduced by this configuration, it advantageously improves the reliability of the module 100.

The foregoing effect can be preferably achieved when the thickness of the semiconductor board 211 is in the range of 50 [μm] or more to 200 [μm] or less, for example. More preferably, the thickness of the semiconductor board 211 is made to be in the range of 50 [μm] or more to 100 [μm] or less. In the range in which the thickness of the semiconductor board 211 is less than 50 [μm], it becomes difficult to ensure the strength of the semiconductor board 211 itself, and in the range in which the thickness is greater than 200 [μm], the strength of the semiconductor board 211 itself becomes too high, and therefore the foregoing effect is difficult to achieve.

Also, by virtue of the present embodiment, the resin member 500 is configured by a thermoplastic resin, and the electronic component 200 can be detached appropriately from the mounting board 300 by a heat process. Also, a material having adhesive properties with respect to the solder-bump 400 and the electrodes 250 and 310 may be used for the thermoplastic resin. For example, the thermoplastic resin may include at least one of an acrylic resin, a polyimide resin, a polyolefin resin, a polybutadiene resin, a novolac resin, and a fluororesin. In particular, since the heat resistances of an acrylic resin, a polyimide resin, and a fluororesin are comparably high (because they tend not to deform or break down when the solder-bump 400 is heated, for example), they may be used preferably.

Also, a metal whose melting point is about 160-230 [°C.] is used for the solder-bump 400. For example, a material of the solder-bump 400 may include tin (Sn), silver (Ag), copper (Cu), bismuth (Bi), antimony (Sb), nickel (Ni) or cobalt (Co), or an alloy of some or all of these. An Sn—Ag—Cu alloy, an Sn—Ag—Cu—Bi—Sb—Ni alloy, an Sn—Ag—Cu—Ni alloy, an Sn—Ag—Bi—Cu—Ni alloy, an Sn—Ag—Ni—Co alloy, an Sn—Bi alloy, an Sn—Bi—Ag alloy or the like may be preferably used, for example.

Note that in the present embodiment a configuration of a so-called front-side illumination solid-state image capturing apparatus was exemplified as the electronic component 200, but in other embodiments, the relation of the positions of the semiconductor board 211 and the wiring structure 212 may be opposite (similar also in the case of a so-called back-side illumination). Also, the configuration of the present embodiment may be applied to another electronic component, that is, in other embodiments, various sensors such as a gyro sensor, an SAW (Surface Acoustic Wave) device, and other MEMS's may be used as the electronic component 200. In such cases, the foregoing capture area R1 and peripheral area R2 may be separated into respectively a first area in which an electrode is not arranged and a second area in which an electrode is arranged. Also, though the configuration of WL-CSP is exemplified in the present embodiment, application to other package configurations of a mounting type using a so-called bump array such as a BGA (Ball Grid Array) is possible for the configuration of the present embodiment.

Hereinafter, an example of a method for manufacturing the module 100 will be described with reference to FIGS. 2A-2L. Each step below can use publicly known semiconductor manufacturing technology for the manufacturing. Note that description is omitted below for simplification, but processing such as a heat process or a cleaning process may be performed as necessary between respective steps.

Figure 2E:
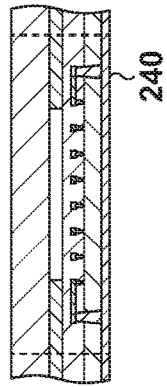
Figure 2F:
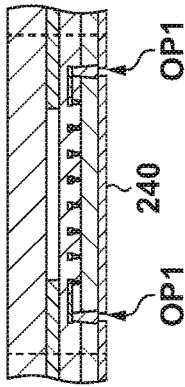
Figure 2A:
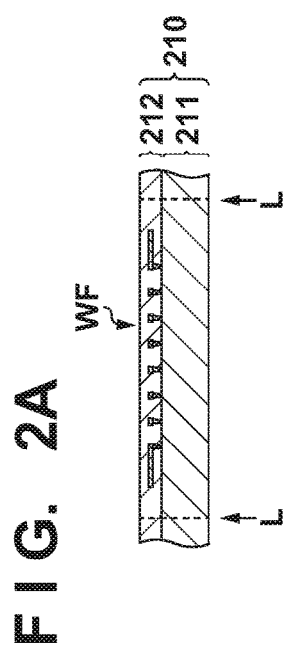

In the step of FIG. 2A, a wafer WF in which the structure 210 including the semiconductor board 211 and the wiring structure 212 are formed is prepared. The broken lines indicate by the arrows L in the drawing correspond to dicing surfaces in a later dicing step.

Figure 2B:
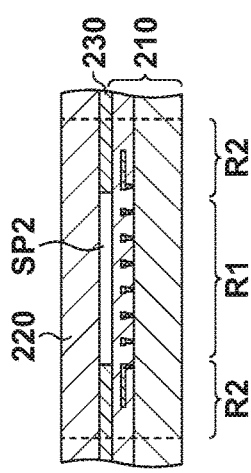

In the step of FIG. 2B the glass board 220 is fixed onto the structure 210 via the adhesion member 230 so as to form the space SP2 between the structure 210 and the glass board 220. A photosensitive dry film of a thickness of approximately 30 [μm], for example, may be used for the adhesion member 230. The adhesion member 230 is formed in a desired area on the structure 210 using, for example, lamination, a photolithography method, or the like, and thereafter, the glass board 220 is pressure bonded thereupon.

Figure 2C:
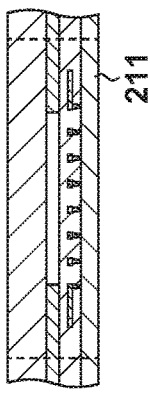

In the step of FIG. 2C, the semiconductor board 211 is made thinner by polishing the back surface side of the semiconductor board 211, and the thickness thereof is made to be approximately 100 [μm]. The polishing may be accomplished by back grinding, chemical mechanical polishing (CMP) or the like.

In the step of FIG. 2D, the through electrode 216 for electrically connecting the electrically conductive member 214 is formed on the back surface side of the semiconductor board 211. This step may be accomplished by, after forming a through hole on the back surface side of the semiconductor board 211 by reactive ion etching (RIE), forming a metal member in the through hole by a deposition method or the like.

In the step of FIG. 2E, the insulating layer 240 is formed on the back surface side of the semiconductor board 211 in which the through electrode 216 is formed. This step may be accomplished by chemical vapor deposition (CVD). In the present embodiment, silicon oxide is used for the insulating layer 240.

In the step of FIG. 2F, an opening OP1 is formed so that the through electrode 216 is exposed to the insulating layer 240 formed on the back surface side of the semiconductor board 211. This step may be accomplished by dry etching or the like.

Figure 2G:
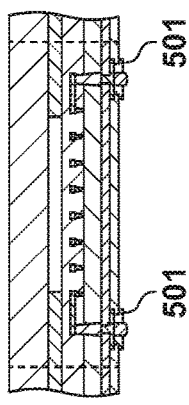

The step of FIG. 2G forms the first electrode 250, which is electrically connected to the through electrode 216, in the opening OP1. This step is accomplished by forming a seed metal such as titanium (Ti), copper (Cu) or the like so as to cover the insulating layer 240 and the opening OP1, for example, and after forming a metal member configured by copper (Cu) thereon, patterning the seed metal and the metal member.

Figure 2H:
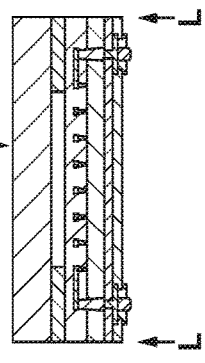

In the step of FIG. 2H is formed a protective film 260 having an opening OP2 for causing the first electrode 250 to be exposed on the bottom surface side of the insulating layer 240. This step may be accomplished by performing exposure processing and development processing after applying a photosensitive and insulating resin material to the bottom surface side of the insulating layer 240.

Figure 2I:
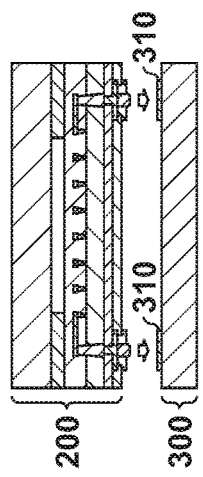

In the step of FIG. 2I, after a flux is applied to the exposed surface of the first electrode 250, a ball-shaped solder-bump 401 is formed on the exposed surface in the opening OP2. The solder-bump 401 corresponds to the previously described solder-bump 400, and is connected to the second electrode 310 in a later step. In the present embodiment, an Sn—Ag—Cu alloy (melting point of approximately 220 [° C.]) is used for the solder-bump 401. Note that in a plan view, the diameter of the solder-bump 401 is smaller than the width of the opening OP2.

Figure 2J:
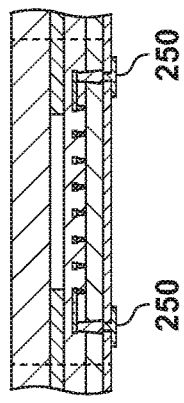

In the step of FIG. 2J, after removal of the flux by a cleaning process, the thermoplastic resin member 501 is formed so as to contact the first electrode 250 (so as to fill in the opening OP2) while covering the side surface of the solder-bump 401. That is, the resin member 501 is formed so as to expose the tip of the solder-bump 401. The resin member 501 corresponds to the previously described resin member 500, and contacts the second electrode 310 in a later step. In the present embodiment, an acrylic resin (a glass-transition temperature of approximately 100 [° C.]) is used for the resin member 501.

Figure 2K:
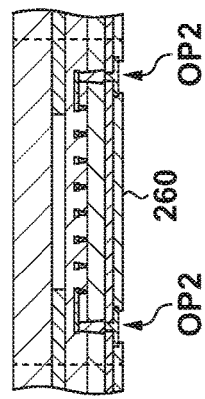

In the step of FIG. 2K, the wafer WF obtained as described above, is diced along the lines of the arrows L. In this way, the electronic component 200 of the WL-CSP configuration described with reference to FIG. 1 is prepared.

Figure 2L:
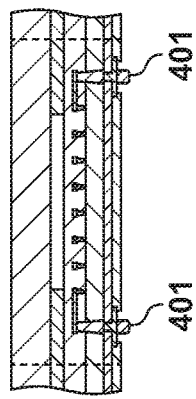

In the step of FIG. 2L, the mounting board 300 is prepared. Then, the electronic component 200 is placed on the mounting board 300 in accordance with the direction of the arrows in the drawing, aligning the position of the first electrode 250 of the electronic component 200 and the second electrode 310 of the mounting board 300 after applying a solder paste to the second electrode 310 of the mounting board 300.

After that, in a state in which the solder-bump 401 is positioned between the first electrode 250 and the second electrode 310, the heat process (reflow of a temperature of 235 [° C.] or more (a maximum temperature of 245 [° C.]) is performed for approximately 30 [sec]. Thereby, the solder-bump 401 is molded, and the solder-bump 400 connected to the second electrode 310 is formed. At that time, the resin member 501 softens in conjunction with the heating, and is formed into previously described resin member 500 by spreading to the mounting board 300 side. As a result, the second electrode 310 is covered by the resin member 500 in a portion other than the portion contacting the solder-bump 400. In particular, by the glass-transition temperature of the resin member 501 (the resin member 500) being less than the melting point of the solder-bump 400, the resin member 501 softens before the melting of the solder-bump 400, and the resin member 501 is formed into the resin member 500 which covers the second electrode 310 appropriately. The module 100 described with reference to FIG. 1 is manufactured as described above.

Note that forming the resin member 501 on the second electrode 310 side rather than forming it on the first electrode 250 side as in the step of FIG. 2J can be considered. However, it should be noted that there is a possibility that by that method, the resin member 501 softened by the foregoing heat process will cover the second electrode 310, and an electrical connection by the solder-bump 400 between the first electrode 250 and the second electrode 310 will not be realized appropriately.

Here, as a comparative example, a module (made to be module 100c to be able to discriminate between them) that uses a thermosetting resin (an epoxy resin here) rather than a thermoplastic resin as the material of the resin member 500 (the resin member 501) was manufactured by a similar procedure to the foregoing method for manufacturing. That is, the comparative example mainly differs to the present embodiment in that in the step of FIG. 2J, a resin member configured by an epoxy resin is formed around the solder-bump 401. According to the module 100c of the comparative example, a deformation of the electronic component 200 accompanying a stress due to shrinkage that can arise upon thermosetting of the foregoing epoxy resin was confirmed.

In contrast to this, in the module 100 according to the embodiment, the influence of shrinkage of the resin at the time of thermosetting is small compared to the case in which the thermosetting resin is used because a thermoplastic resin is used for the resin member 500 (the resin member 501). Accordingly, the influence on the module 100 of stress arising between respective members is small, and the reliability of the module 100 is advantageously improved by virtue of the present embodiment.

Also, as previously described, by virtue of the present embodiment, the resin member 500 is configured by a thermoplastic resin, and the electronic component 200 can be detached appropriately from the mounting board 300 by a heat process. Accordingly, by virtue of the present embodiment, there is an advantage in cases in which attachment (mounting) of the electronic component 200 to the mounting board 300 is redone and cases in which the electronic component 200 attached to the mounting board 300 is switched with another electronic component.

Figure 3:
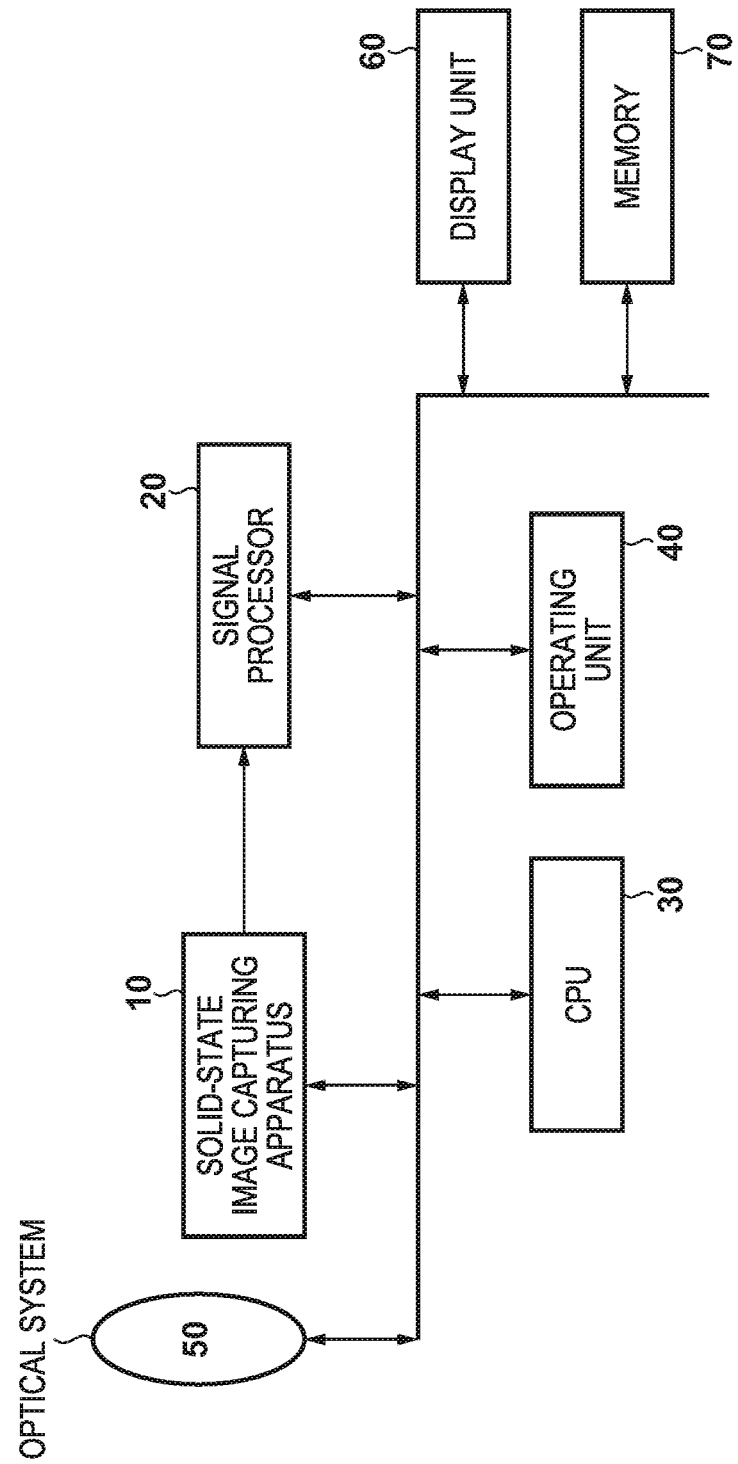
FIG. 3 is a view for describing an example of a configuration of a camera.

FIG. 3 is a view for describing an example of a system configuration of a camera which is an example of an electronic device to which the module 100 is applied. The electronic component 200 which the module 100 comprises is a solid-state image capturing apparatus (made to be a solid-state image capturing apparatus 10), and the camera is equipped with, for example, a processor 20, a CPU 30, an operating unit 40, and an optical system 50 in addition to the solid-state image capturing apparatus 10. Also, the camera may be further equipped with a display unit 60 for displaying still images and moving images, and a memory 70 for storing data thereof. The solid-state image capturing apparatus 10 generates image data comprising a digital signal based on a light that passes through the optical system 50. Predetermined image processing is performed on the image data by the processor 20, and it is outputted to the display unit 60 and the memory 70. Also, if an image capturing condition inputted via the operating unit 40 is changed, by the CPU 30, the setting information of each unit may be changed, or the method for controlling each unit may be changed. Note that apparatuses (for example, a personal computer, of a mobile terminal) supplementally comprising an imaging function, and not only apparatuses whose main purpose is imaging are encompassed in the concept of a camera.

Also, while preferred embodiments of the present invention and variations thereof are described above, the present invention is not limited to these examples, and these may be modified in a scope that does not deviate from the gist of the invention. Also, the individual terms recited in the present specification are merely used with the objective of describing the present invention, and it goes without saying that the present invention is not limited to the strict meaning of these terms, but includes equivalents thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-097385, filed on May 13, 2016, which is hereby incorporated by reference herein in its entirety.

What is claimed is:

1. A module, comprising:
an electronic component having a first electrode;
a mounting board having a second electrode;
a solder-bump configured to connect the first electrode and the second electrode; and
a thermoplastic resin member configured to contact both the first electrode and the second electrode and cover the solder-bump, so as to form a space between the electronic component and the mounting board.

2. The module according to claim 1, wherein
a glass-transition temperature of the resin member is lower than a melting point of the solder-bump.

3. The module according to claim 2, wherein
the second electrode is not exposed to the space.

4. The module according to claim 2, wherein:
the solder-bump is a first solder-bump;
the electronic component further comprises a third electrode;
the mounting board further comprises a fourth electrode;
the module further comprises a second solder-bump that connects the third electrode and the fourth electrode; and
the space is positioned between the first solder-bump and the second solder-bump.

5. The module according to claim 4, wherein
the resin member is a first resin member;
the module further comprises a second thermoplastic resin member that contacts both the third electrode and the fourth electrode, and covers the second solder-bump; and
the first resin member and the second resin member do not contact each other.

6. The module according to claim 2, wherein:
the electronic component is an image sensor;
the electronic component includes, in a plan view in relation to a surface opposite to the mounting board, a capture area that forms an image capturing surface and a peripheral area thereof; and
the first electrode is arranged in the peripheral area.

7. The module according to claim 2, wherein:
the electronic component has:
a semiconductor device;
an opposing board arranged on a side opposite to a side of the mounting board in relation to the semiconductor device so as to be opposing the semiconductor device; and
a coupling member configured to couple the semiconductor device and the opposing board so as to form a space between the semiconductor device and the opposing board, and
wherein
the coupling member is arranged so as to overlap the first electrode in the plan view.

8. The module according to claim 7, wherein
the semiconductor device is connected to the first electrode and has a through electrode that penetrates the semiconductor board of the semiconductor device.

9. The module according to claim 2, wherein
the resin member includes at least one of an acrylic resin, a polyimide resin, a polyolefin resin, a polybutadiene resin, a novolac resin, and a fluororesin.

10. An electronic device, comprising:
a module; and
a processor configured to process a signal from the module, wherein
the module comprises:
an electronic component having a first electrode;
a mounting board having a second electrode;
a solder-bump configured to connect the first electrode and the second electrode; and
a thermoplastic resin member configured to contact both the first electrode and the second electrode and cover the solder-bump so as to form a space between the electronic component and the mounting board, and
wherein a glass-transition temperature of the resin member is lower than a melting point of the solder-bump.

11. A method for manufacturing a module, comprising:
preparing an electronic component having a first electrode;
forming a solder-bump on the first electrode;
forming a thermoplastic resin member so that the resin member contacts the first electrode, and exposes the solder-bump;
preparing a mounting board having a second electrode; and
electrically connecting the first electrode and the second electrode by heating the solder-bump in a state in which the solder-bump is positioned between the first electrode and the second electrode, wherein
in the heating, the resin member contacts both the first electrode and the second electrode while covering the solder-bump, so as to form a space between the electronic component and the mounting board.

12. The method according to claim 11, wherein
the resin member covers the solder-bump in the forming of the resin member.

13. The method according to claim 11, further comprising detaching the electronic component from the mounting board by heating the resin member and the solder-bump,
wherein a glass-transition temperature of the resin member is lower than a melting point of the solder-bump.

* * * * *